US 6,750,124 B1

(12) United States Patent
Mitan et al.

(10) Patent No.: US 6,750,124 B1
(45) Date of Patent: Jun. 15, 2004

(54) DIRECT PATTERNING OF NANOMETER-SCALE SILICIDE STRUCTURES ON SILICON BY ION-BEAM IMPLANTATION THROUGH A THIN BARRIER LAYER

(75) Inventors: Martin Mitan, Phoenix, AZ (US); David P. Pivin, Jr., Phoenix, AZ (US); James W. Mayer, Phoenix, AZ (US); Terry L. Alford, Phoenix, AZ (US)

(73) Assignee: Arizona Board of Regents, Tempe, AZ (US)

( * ) Notice: Subject to any disclaimer, the term of this patent is extended or adjusted under 35 U.S.C. 154(b) by 0 days.

(21) Appl. No.: 10/071,756

(22) Filed: Feb. 6, 2002

Related U.S. Application Data
(60) Provisional application No. 60/266,652, filed on Feb. 6, 2001.

(51) Int. Cl.$^7$ .............................................. H01L 21/44
(52) U.S. Cl. .................. 438/583; 438/514; 438/592; 438/649; 438/651; 438/655; 438/664; 438/682
(58) Field of Search .......................... 438/655, 660–664, 438/649, 651, 682, 683, 300, 299, 630, 581, 583, 592, 514–517

(56) References Cited

PUBLICATIONS

Matsushita et al ["Narrow CoSi2 Line formatin on SiO2 by Focused Ion Beam", Ion Implantation Technology 98, International Conference on Ion Implantation Technology Proceedings, 12th, Kyoto, Jun. 1998, vol. 2, pp 861–864].*
"Formation and Growth of $CoSi_2$ on (001)Si inside 0.2–2 μm oxide openings prepared by electron–beam lithography"; J.Y. Yew, et al.; May/Jun., 1999.
"Characterization of the local mechnaical stress induced during the Ti and Co/Ti salicidation in sub–0.25 μm technologies"; An Steegen, et al.; Oct. 15, 1999.
"Submicron $CoSi_2$ structures fabricated by focused ion beam implantation and local flash lamp melting"; L. Bischoff, et al.; 1996.
"Focused ion–beam structuring of Si and $Si/CoSi_2$ heterostructures using adsorbed hydrogen as a resist"; May/Jun., 1999.
"Method for fabricating submicron silicide structures on silicon using a resistless electron beam lithography process"; D. Drouin, et al.; Jun. 1997.
"Effect of Ion Irradiation on the Formation of Ni, Cr and Pt Silicide"; Wielunski, et al.; 1982.
"Formation of $CoSi_2$ by ion beam mixing and rapid thermal annealing"; Niewöhner, et al.; 1991.
"Influence of oxide thickness on ion–beam induced and thermal $CoSi_2$ formation"; Dehm, et al.; 1993.
"Ion–Beam Mixed Ultra–Thin Cobalt Silicide (Co $Si_2$) Films by Cobalt Sputtering and Rapid Thermal Annealing"; Kal, et al.; 1995.
"Formation and kinetics of ion–induced yttrium silicide layers"; T.L. Alford; Feb. 1995.
"On the thermodynamical driving force during ion mixing of the Co–Si system"; W. Xia, et al.; Mar., 1989.
"Silicides and ohmic contacts"; J.P. Gambino, et al.; 1998.
"The Application of Ion Beam Mixing, Doped Silicide, and Rapid Thermal Processing to Self–Aligned Silicide Technology"; Y.H. Ku, et al.; Feb., 1990.

* cited by examiner

*Primary Examiner*—Thanh Nguyen
(74) *Attorney, Agent, or Firm*—Robert D. Atkins; Quarles & Brady Stretch Lang LLP

(57) ABSTRACT

Direct focused ion beam (FIB) mixing is given as a method for patterning of metal silicide structures on a silicon surface. This technique allows the fabrication of submicron structures without the use of resist-based lithography methods. VLSI containing metal silicide connects, interconnects and structures may be prepared by the method. Fast semiconductor devices having good circuit speed and reduced RC time delay including the technologies MEMS, MOSFET, CMOS, pMOS, nMOS and BiCMOS result.

23 Claims, 5 Drawing Sheets

DIRECT PATTERNING OF NANOMETER-SCALE SILICIDE STRUCTURES ON SILICON BY ION-BEAM IMPLANTATION THROUGH A THIN BARRIER LAYER

CROSS-REFERENCE TO RELATED APPLICATIONS

This application is based upon and claims priority from prior U.S. patent application Ser. No. 60/266,652 filed Feb. 6, 2001, the entire disclosure of which is herein incorporated by reference.

FIELD OF THE INVENTION

The present invention is directed generally to fabrication of semiconductor devices and, more particularly, to a direct-write process for manufacturing ultra-thin metal silicide contacts, interconnects and structures in integrated circuits by focused ion beam implantation.

BACKGROUND

Semiconductor devices comprise integrated circuits that perform ever more complicated and faster operations. As device dimensions shrink, the devices must increase. These changes require refinement in integrated circuit design and manufacturing processes. Of especial importance is manufacture of contacts in technologies such as MEMS, MOSFETS, CMOS, nMOS, pMOS and BiCMOS.

In order to maintain speed in the devices, the contacts must have nanometer dimensions and have low resistivity. Transition metal silicides, especially titanium, cobalt and nickel have been used for this purpose.

However, shrinking device dimensions makes it increasingly difficult to fabricate high quality silicide contacts. For example, local stresses inherent at the encroaching boundaries of oxide or spacer layers pose problems for the growth of small self-aligned silicides (J. Y. Yew and L. J. Chen, J. Vac. Sco. Technol. B 17, 939—1999). Decreasing critical dimension also causes a downward shift in the agglomeration temperature of silicide phases (A. Stegen, I. D. Wolf, and K. Maex, Jr. Appl. Phys. 86, 4290—1999). This ultimately necessitates varied process conditions and affects variability.

Resist-based lithography, particularly photolithography, has generally been used in the fabrication process for VLSI circuits and is among the methods used for refining manufacturing processes and improving performance. In this technique, photoresistant masks are employed at selected fabrication process steps to prevent exposure to layering materials as a device is being built. The masks generally comprise polymers. However, the size of devices has reached the limits that can be achieved with masks. Morover, the processes are complicated, lengthy and environmentally unfriendly.

Direct write techniques have been proposed as alternative approaches for silicide fabrication. The use of masks usually limits features to about 1 to 2 micrometers in size, whereas direct writing permits features having dimensions of sub-micrometers. Bischoff et al. (L. Bischoff, K.-H. Heinig, J. Teichert, and W. Skorupa, Nucl. Instrum. Methods Phys. Res. B 112, 201 (1996)) have fabricated CoSi 2 structures by focused ion beam (FIB) implantation of Co (1) to form wires with dimensions as low as 250 nanometers. Fuhrmann et al. H. Fuhrmann, M. Do "beli, and R. Mu" hl., J. Vac. Sci. Technol. B 17945 (1999)) used FIB implantation to mask silicon by local desorption of hydrogen from an HF-passivated surface. This method was applied to produce 160 nm wide CoSi (II) wires in a Si/CoSi(II) heterostructure. Drouin, et al (D. Drouin, J. Beauvais, R. Lemire, E. Lavelle'e, R. Gauvin, and M. Caron, Appl. Phys. Lett. 70, 3020 (1997)) used electron-beam lithography, to produce nanometer-scale platinum suicides. This process, termed silicide direct write electron-beam lithography, relies on localized heating of thin platinum layers on silicon to initiate silicidation.

To meet the growing demand for smaller, faster semiconductor devices, new methods for producing reliable silicides having low resistivity and dimensions in the nanometer range continue to be sought.

SUMMARY

It is an object of the present invention to provide a direct-write process for forming localized transition metal suicides on a semiconductor substrate.

It is a further object of the present invention to provide MEMS, MOSFET, CMOS, pMOS, nMOS and BiCMOS semiconductor devices comprising contacts, interconnects and structures formed by the present process.

The present invention provides a direct-write process for forming localized metal silicides at one or more selected areas on a silicon substrate using focused ion beam (FIB).

In the process, the substrate, preferably a silicon wafer, is treated to form a first barrier layer thereon and then a second metal layer on the barrier layer. A focused ion beam is directed through the barrier layer and the metal layer to the selected area of substrate. The FIB causes disruption of the barrier layer over the selected area of substrate. With a single low temperature anneal, metal and silicon react at this area to form metal silicides structures having nanometer dimensions on the substrate. The substrate is again annealed at a higher temperature, depending on the particular metal employed, to perfect the morphology of the silicides. Some metal systems such as nickel do not require a second anneal.

In an important aspect of the present invention, the process may be used to form low resistive, nanometer scale metal silicide structures between components of integrated circuits on a silicon substrate. In these instances the locations of the selected areas on the silicon substrate are chosen to be in contact with areas housing the components. The process for forming these structures comprises in addition the step of removing unreacted metal from areas not exposed to the focused ion beam after a first annealing step. Finally, the barrier layer outside areas exposed to the focused ion beam is removed.

In preferred instances of the invention, the metal is a transition metal or a rare earth element. Metal, for example, may be selected from the group comprising nickel (Ni), cobalt (Co), palladium (Pd), chromium (Cr), platinum (Pt), tungsten (W), vanadium (V), titanium (Ti), Indium (In), iridium (Ir), hafnium (Hf) and rubidium (Rb).

The barrier layer is preferably a silicon oxide or nitride.

In a preferred embodiment of the invention a direct-write process is given for formation of cobalt suicides on a silicon wafer. In the process, localized cobalt suicides are formed at one or more selected areas on a silicon substrate. In the process a substrate is provided, preferably a silicon wafer having a surface cleaned by any of the methods known in the art. A first barrier layer of silicon oxide is formed on the substrate, most preferably between 2 to 4 nanometers in thickness and a second cobalt layer, most preferably less than 50 nanometer in thickness, is formed on the barrier layer. A focused ion beam, preferably As$^{++}$, is directed through the cobalt layer and the barrier layer to the selected substrate areas, under conditions whereby the barrier layer is disrupted at regions above the selected areas on the silicon wafer and cobalt is caused to react with silicon substrate at the disrupted barrier layer areas. The wafer is annealed at a first temperature of about 300° C. to 500° C. Unreacted cobalt is removed by a selective etch and the wafer is annealed at a second higher temperature of about 700° C. to 900° C. to enhance the morphology of the cobalt silicide. The wafer is finally etched to remove barrier formed outside the area exposed to the focused ion beam.

In an important aspect of the present invention, metal silicides formed at localized areas on a silicon by the process of the present invention are provided. The silicides have low resistivity and dimensions in the nanometer range. These properties make them especially suitable as contacts, interconnects and similar structures in integrated circuits in a large variety of semiconductor devices. Such devices may involve, for example, any of the technologies MEMS, MOSFET, CMOS, pMOS, nMOS and BiCMOS.

DETAILED DESCRIPTION OF THE PREFERRED EMBODIMENTS

The process of the present invention relies on the effects of ion-beam mixing and radiation-induced diffusion, which together are instrumental in activating the silicidation process across a barrier layer, preferably an interfacial oxide boundary. This barrier layer, preferably an oxide boundary, prevents the reaction of metal areas unexposed to ions with the underlying silicon, thus allowing the realization of direct write CoSi$_2$ structures.

Figure 1:
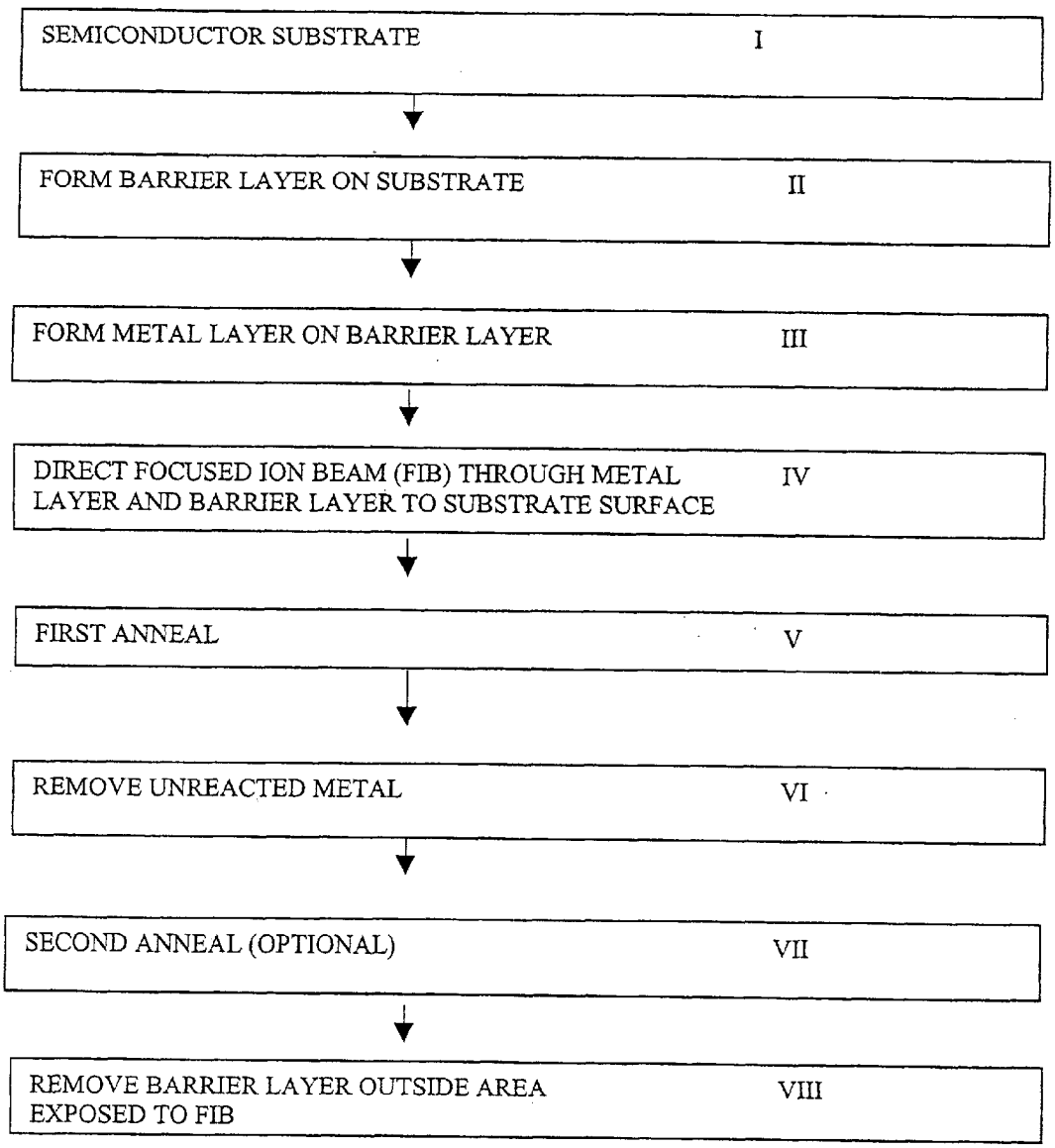
FIG. 1 is a flow diagram of the separate steps of the present direct-write process for forming metal suicides on a semiconductor substrate according to the principles of the present invention.

Referring now to FIG. 1, Steps I–III illustrate the preparation of a layered structure on a substrate wafer suitable for use in the process of the present invention.

In Step I, a suitable substrate is provided. The substrate is preferably silicon or doped silicon, wafer that is treated to remove chemical contaminants and surface defects by any of the methods known in the art.

In Step II, a barrier layer is grown on the wafer. The barrier layer may be an oxide or a nitride of silicon. A nitride barrier layer may be formed by methods known in the art by deposition or annealing in an ammonium atmosphere. In preferred embodiments where the barrier layer is a silicon oxide, it may be formed by wet bath treatment with a peroxide solution preferably by submersing the clean silicon wafer in a bath of dilute hydrogen peroxide for a controlled period of time, concentration and temperature. This oxide boundary or impurity layer, described by Wielunski (L. S. Wielunski, C-D. Lien, B-X Liu, and M-A. Nicolet, *Metastable Materials Formation by Ion Implantation*, North-Holland, N.Y., (1982), pp. 139–145 and subsequently others, (L. Niewo "hner and D. Depta, Nucl. Instrum. Methods Phys. Res. B 59, 523 (1991); C. Dehm, I. Kasko, E. P. Burte, J. Gyulai, and H. Ryssel, Appl. Surf. Sci. 73, 268 (1993); S. Kal, I. Kasko, and H. Ryssel, J. Electron. Mater. 24, 1349 (1995) prevents the reaction of unexposed metal areas with the underlying silicon, thus allowing the realization of direct write CoSi$_2$ structures.

The parameters of the barrier layer formation are chosen to provide a thickness of layer suitable for supporting the silicidation reaction at the areas of implant. A layer that is too thin will cause the silicidation reaction to occur across the entire surface of the wafer and completely obscure any effect of the implantation. An oxide layer that is too thick will result in no effect after ion implantation, thermal processing and final oxide removal with the result that silicon substrate remains bare. In the preferred embodiment of the present process for forming cobalt silicides, the oxide layer, formed by the hydrogen peroxide reaction, is greater than about 2 nanometer and less than about 4 nanometer.

In Step III, a metal layer is formed. In preferred embodiments the metal is cobalt but other transition metals and certain rare earth elements including, but not limited to Ni, Co, Cr, Pd, Pt, W, V, Ti, In, Er, Hf and Rh may also be used in the present process. In a preferred embodiment, cobalt is evaporated onto the oxide layer by electron-beam evaporation at a controlled rate and pressure. The thickness of the metal layer is chosen to provide uniform composition after ion implantation. It has been observed that when a certain thickness of layer is exceeded, reacted areas appear as fragments lacking continuity. An explanation for this result may be that the thick metal increases the stopping power of the layer to incident implanted ions. As a result, a consistently lower flux of ions penetrates the oxide/silicon interface, which does not produce enough damage to the oxide layer to allow for migration of the reacting species during the subsequent annealing treatments. In the preferred embodiment of the present process, the thickness of the metal layer, cobalt, is less than about 50 nm for optimal results.

Optionally, during small runs, for example, a thin layer of silicon may be deposited on the metal to prevent contamination of the metal layer by oxygen. This is especially important, e.g., for rare earth silicides such as yttrium silicides that oxide readily in air (T. L. Alford, J. Appl. Phys. 77(3) 1010 (1995)). A silicon cap of about 5 nm may be deposited on the metal in the metal deposition system without breaking the vacuum of the metal deposition step. In most large scale operations the protecting cap is not necessary because the metal layer is not exposed to oxygen during the layering process.

In Step IV a focused ion beam is directed through the surface layers to the underlying bulk silicon wafer,. A Nanofab 150 or similar FIB system capable of generating a sufficient flux of focused ions to the substrate to cause local disruption in the barrier layer is a suitable tool for use in the present process. In preferred embodiments the Nanofab 150 is used to implant 200 keV As$^{++}$. By varying the dwell time a desired dose range may be achieved. In the case of the present process for cobalt silicide formation, the optimal dose range of approximately $2.5–500 \times 10^{14}$ cm$^{-2}$ (A. Steegen, I. D. Wolf, and K. Maex, J. Appl. Phys. 86, 4290 (1999)) was achieved. The actual dose may be chosen to maximize the properties such as low resistivity of the particular metal silicide formed.

FIB mixing of the film layers forms regions of vacancy and interstitial pairs in the silicon substrate. Additionally, the interfacial barrier oxide is locally disrupted. These damaged regions provide excellent diffusion channels for metal t and silicon atoms, significantly lowering the activation energy for metal silicide formation. This has been observed for cobalt silicides (S. Kal, I. Kasko, and H. Ryssel, J. Electron. Mater. 24,1349 (1995)). Furthermore, beam interaction introduces metal atoms into the silicon by the secondary implant-collision cascade. Upon annealing, the implanted regions exhibit reduced kinetic restrictions due to beam mixing and by enhanced atomic mobilities; the reactions are then driven by thermodynamics (W. Xia, C. A. Hewett, M. Fernandes, S. S. Lau, and D. B. Poker, J. Appl. Phys. 65,2330 (1989)). Areas where no implant was performed have an undamaged interfacial oxide layer, which is a good migration barrier for the cobalt and inhibits the silicide reaction in non-selected areas of substrate.

In Steps IV to VI, the implanted wafer is treated through the SALICIDE (self-aligned silicide) process. For certain metals, cobalt, e.g., two anneal steps are required. For nickel only one anneal step is necessary. Preferably annealing is performed through rapid thermal anneal (RTA) under nitrogen ambient.

In the process of the present invention for forming structures for integrated circuits, a selective etch is performed after the first annealing, or between the two annealings in other instances, to remove unreacted metal and contaminants formed during the annealing process. Removal of unreacted metal prior to a second heat treatment enhances the integrity of the silicide bands perimeters by preventing lateral layer overgrowth and possible reaction of metal with the silicon in non-implanted areas. Preferred selective etch process comprises treatment of the implanted substrate with $HNO_3:H_2O$ (1:1) solution for about 30 seconds.

In step IV annealing of the implanted substrate occurs at a temperature of about 350° C. to 500° C. as is suitable, for example for cobalt silicide formation. The temperature range and time of annealing are determined by the nature of the metal used in the process although the limit of 350° C. to 500° C. illustrates the temperatures commonly used in the SALICIDE process, but is not intended to limit the process of the present invention to this temperature range.

After the first anneal the substrate may be treated to remove surface oxides formed during the initial anneal which inhibit the functionality of the metal etch. These oxides may be removed by dipping the die in a dilute HF solution, 20:1, for example for about 20 seconds.

After excess metal removal and secondary heat treatment fabricated structures are present only in the implanted areas. The removal of unreacted metal prior to the second heat treatment is crucial in preventing lateral layer overgrowth and possible reaction of metal with the silicon in nonimplanted areas.

In Step VII a final high temperature anneal is performed. As discussed hereinabove, the temperature range and time of annealing are determined by the nature of the metal used in the process and the limit of 700° C. to 900° C. C illustrates the temperatures commonly used in a two-anneal SALICIDE process, but is not intended to limit the process of the present invention to this temperature range.

Finally barrier layer remaining on the substrate outside the implanted area is removed, preferably by wet etching by methods known in the art.

Process refinement with regard to thinner initial layers, anneal time and temperature, reduced beam energy, and improved beam confinement should produce linewidths better than 100 nm. Furthermore, the flexibility of the FIB system in this process enables the study of nanostructured silicides for novel devices or mesoscopic electron transport structures.

In an important aspect of the present invention, contacts, interconnects and structures in integrated circuits formed on a silicon substrate by the present process are provided. Nanometer scale metal silicides of very low resistivities may be grown at chose localized areas on a silicon substrate to provide integrated circuits having good circuit speed and reduced RC time delay. Integrated circuits, including VLSI circuits having contacts, interconnects and structures formed by the present process are provided. Semiconductor devices comprising integrated circuits made by the present process are provided. These semiconductor devices include the technologies MEMS, MOSFET, CMOS, pMOS, nMOS and BiCMOS.

EXAMPLE

This example illustrates the preparation of silicon test devices having localized cobalt silicide on a silicon wafer.

Figure 2:
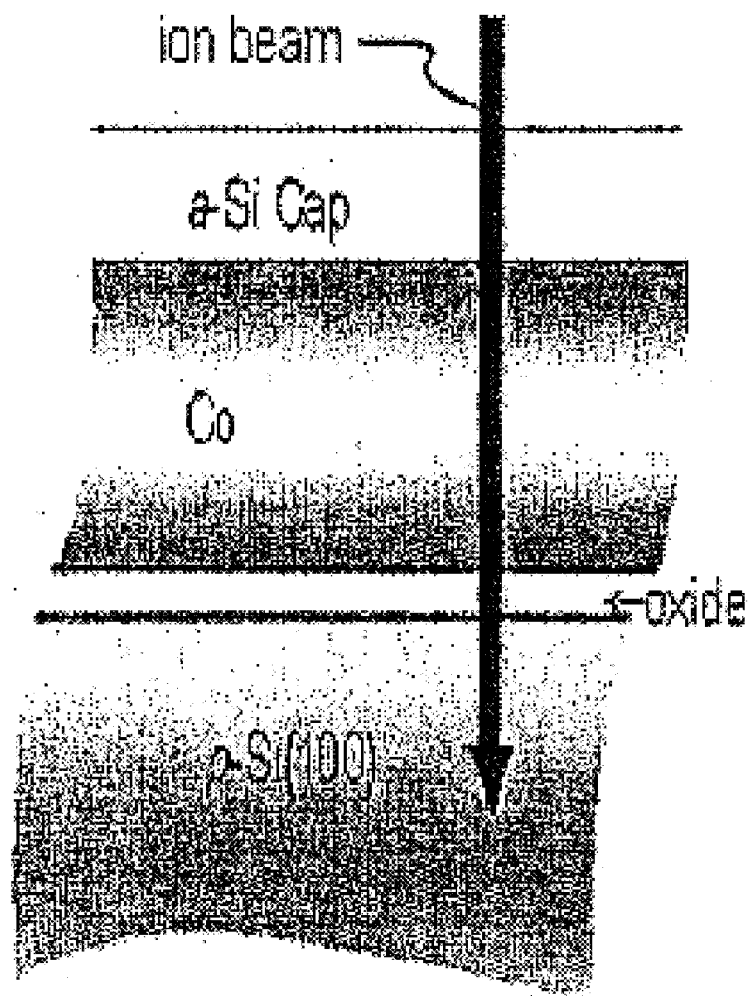
FIG. 2 illustrates film layers inside process windows prior to focused ion beam (FIB) implantation showing substrate silicon with successive layers of barrier layer (silicon oxide), metal layer (cobalt) and an α-silicon cap with illustration of the implantation ion beam directed through these layers to the underlying substrate.

A 300 nm field oxide layer was grown on a p-type (100) 10–20 V cm silicon wafer. Large rectangular windows, outlined with alignment marks, were then patterned in the oxide film by wet processing to facilitate the location of structures in the FIB system and during subsequent analysis. In the HF etched openings, an ultrathin; 2 nm silicon oxide layer was grown by immersion in an 80° C. bath of dilute hydrogen peroxide, approximately 15% for 2 minutes. Next, a cobalt layer of 34 nm was evaporated onto the wafer by electron-beam evaporation at a deposition rate of 0.2 nm/s with a base pressure of 2310 26 Torr. Subsequently, without breaking the vacuum of the deposition system, 5 nm of silicon was evaporated as a capping layer. The silicon cap prevents contamination of the cobalt film by oxygen. The layers inside the patterned windows are shown, as prepared, in FIG. 2.

Using a Nanofab 150 FIB system, 200 keV As$^{++}$ ions were implanted through the surface layers into the underlying bulk silicon. TRIM 17 calculations predicted the range and straggle of implanted As$^{++}$ ions normal to the surface as 76 nm and 43 nm, respectively. Lines were drawn with a 24 pA beam at a spot size of approximately 80 nm stepped by discrete increments of 13 nm. By varying the dwell time from 4 to 800 ms, the desired dose range (approximately $2.5–500 \times 10^{14}$ cm$^2$) was achieved.

The implanted wafer was then sectioned into individual die containing the test structures.

Each die was individually treated through the self-aligned silicide ~SALICIDE process. Thermal processing was performed in an ASTP-50 rapid thermal anneal, (RTA). Heating ramp rates were approximately 100° C./s for low temperatures and approaching 150° C./s for temperatures above 700° C. The initial RTA step was 500° C. for 40 s, followed by a second step of 750° C. for 30 s. All RTA processing was performed under nitrogen ambient.

Between anneals, unreacted metal was removed by a 30 second selective etch in a $HNO_3$:$H_2O$ (1:1) solution. Prior to the selective etch, the sample was immersed in dilute 20:1 HF solution for 20 seconds to remove the surface oxides formed during the initial anneal which inhibit the functionality of the metal etch.

Finally, a 10 second dilute HF dip removed the remaining interfacial surface oxide outside the implanted boundaries.

Electrical Measurement of Silicide Structures

Samples were analyzed with a Hitachi S4700 field emission scanning electron microscope and a JEOL 2000FX transmission electron microscope (TEM) both with electron microprobe capability.

Four-terminal-test structures were formed for electrical measurements. "H" patterns, 80 mm in length, were implanted in the test regions for evaluation of sheet resistance. Electrical measurements of the four-terminal test structures resulted in resistivities ranging from 12 to 23 mV cm, depending on the implanted dose above the threshold value.

Figure 4:
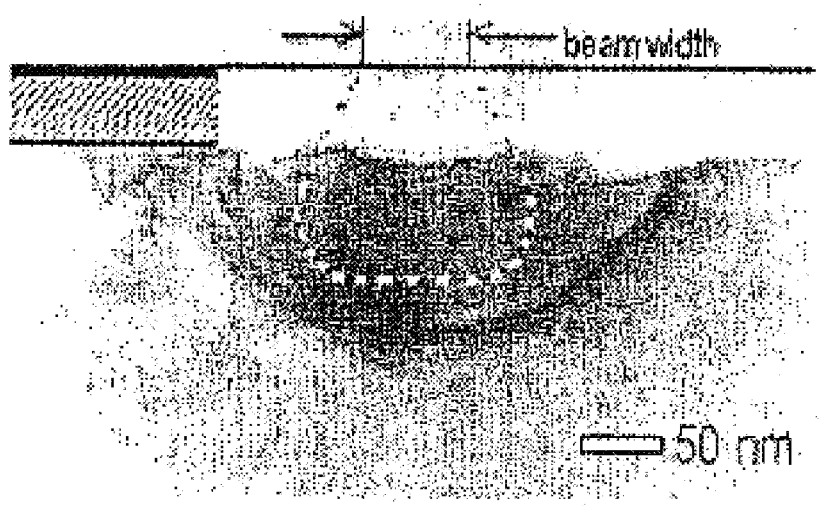
FIG. 4 is a cross-sectional view of a CoSi$_2$ wire formed by the present ion beam process. The dotted outline represents the implant profile in the as-deposited (prior to implantation) layer structure. The insert represents the as-deposited layers above the silicon (100) substrate, as illustrated in FIG. 2. Inset layers are (from top to bottom essentially to scale) α-Si, Co and SiOx. The solid line across (b) represents the height of the surface prior to the implant. Arrows depict beam width.

By electron beam evaporation, contact pads of aluminum were applied via the liftoff method known to the art. Measurements were conducted with a Keithley 236 source-measure unit. FIG. 4 shows a SEM micrograph of the described electrical measurement. The aluminum contact pads were 80 mm in width and 150 mm in height. The resistivities of the $CoSi_2$ lines were within reported values (J. P. Gambino and E. G. Colgan, Mater. Chem. Phys. 52,99 (1998)). Higher implant doses lead to smoother lines and lower estimated resistivity. This is attributed to the higher damage density at the oxide interface, resulting in deeper cobalt diffusion during the initial RTA treatment and a better-defined reaction boundary.

Morphology and Composition of Silicide Structures

Figure 3:
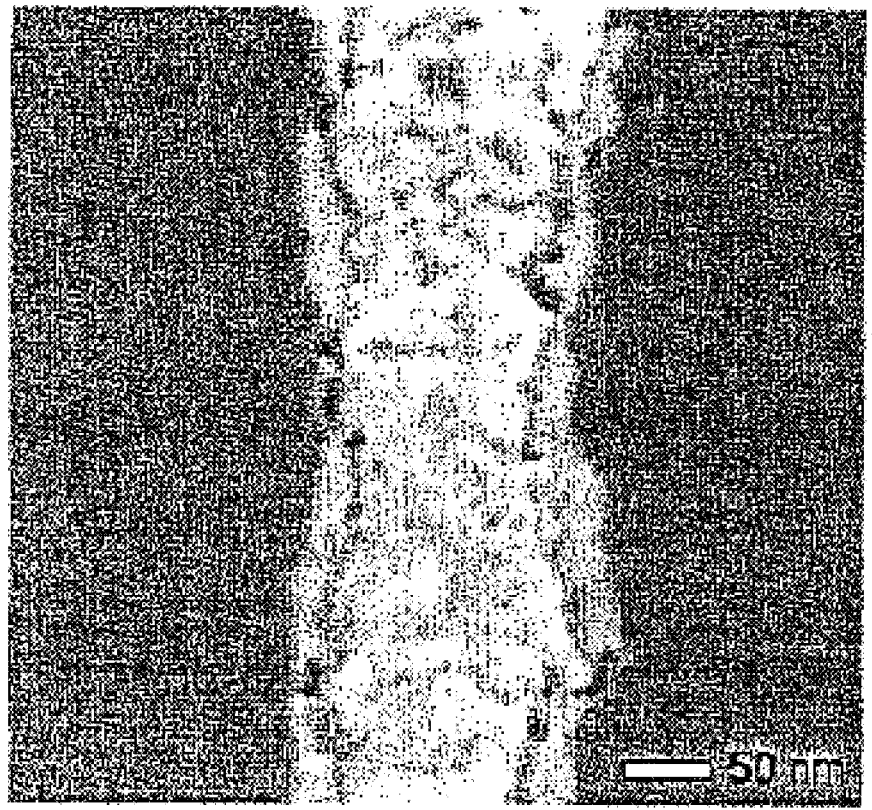
FIG. 3 is a photograph of (plan view of) a CoSi$_2$ wire formed by the present focused ion beam process.

High magnification scanning electron microscopy (SEM) and TEM images of the resulting lines reveal the as-grown structures to be polycrystalline. FIG. 4 illustrates the observed surface morphology of a fabricated structure. The apparent grain size was comparable across the entire area of the features and variation in linewidth was persistent. The width of this particular line ranged from 150 to 230 nm. Energy dispersive spectroscopy microprobe examination of the structures showed the presence of cobalt; whereas, the surrounding dark regions only revealed silicon. Examining a similar line, FIG. 4 by cross section TEM, reveals the subsurface evolution of line growth. The final dimension of this single pixel line (FIG. 4) was approximately 230 mm, and the center of the line has grown to an average depth of 80 nm. The inset in FIG. 3 shows the film layers prior to implantation. Also included is a dotted trace of the implanted beam profile into the as-prepared sample. The dotted interaction profile was deduced from TRIM calculations of the projected range and the lateral and radial beam spread of implanted ions.

Figure 5:
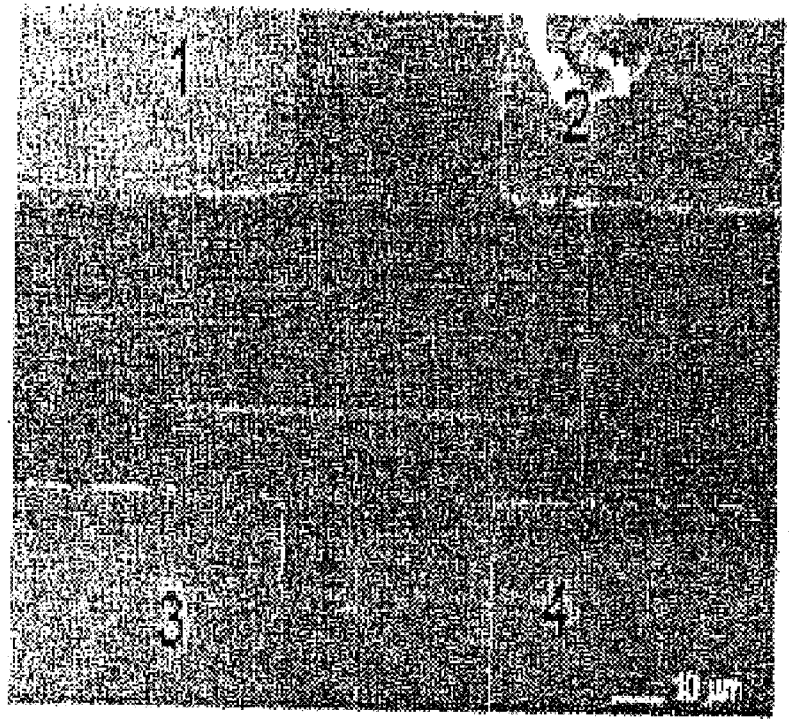
FIG. 5 is a scanning electron microphotograph (SEM) of sheet resistance test structures with deposited contact pad metal. Measured 18 mV and 39 mV for the high and low doses respectively. Assuming maximum width of 0.25 µm and a thickness of 0.075 µm, the resistivity would be ~12 µΩcm and 23 µΩcm for the high and low dose, respectively. The oxide layer grown in hydrogen peroxide was retained to isolate the structure from the p-type silicon.

From FIG. 5, it is clear that the silicided area extends past the area of beam interaction at the oxide boundary. During the first RTA treatment, cobalt primarily diffuses into the substrate aided by damage resulting from beam interaction. This is prominent at the center of the implanted profile, where the silicide is deepest. Additional diffusion of excess cobalt also occurs laterally by classical means requiring the generation of point defects. Since these migration events obviously occur at different rates, adjustment of time/temperature of the first RTA step can limit the amount of the lateral growth. Incorporation of a thinner metal supply layer should limit the atoms available for unwanted diffusion. A thinner cobalt layer would also decrease the amount of beam spread present at the metal/oxide interface and below. This would result in a smaller intermixed oxide area and a shallower damage profile, leading to improved line resolution.

As noted above, the present invention provides a direct-write process for localized formation of metal silicides on a semiconductor substrate. Semiconductor devices comprising the metal suicides in integrated circuits have been given. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification that variations and modifications of such embodiments and methods may be made without departing from the spirit and scope of the invention. The claims are intended to cover such modifications and devices.

We claim:

1. A method of forming metal silicide by focused ion-beam implantation, comprising:
   providing a silicon substrate;
   forming an oxide layer having a thickness between 2–4 nanometers over the silicon substrate;
   forming a metal layer having a thickness between 34–50 nanometers over the oxide layer; and
   implanting ions into localized regions of the silicon substrate by focusing an ion-beam to penetrate through the metal layer and further to penetrate through the thickness of the oxide layer into the silicon substrate, wherein the oxide layer above the localized regions is disrupted by the ion-beam so that the metal layer reacts with the silicon substrate to form the metal silicide in the localized regions of the silicon substrate.

2. The method of claim 1, wherein the metal layer is formed with cobalt, nickel, chromium, palladium, platinum, wolfram, vanadium, titanium, indium, erbium, hafnium, or rhodium.

3. The method of claim 1, further including the step of disposing a silicon layer over the metal layer.

4. The method of claim 1, wherein the focused ion-beam implants $As^{++}$ ions.

5. The method of claim 1, further including the step of annealing the silicon substrate.

6. The method of claim 5, further including the step of removing unreacted portions of the metal layer.

7. The method of claim 6, further including the step of removing the oxide layer.

8. A method of making a semiconductor device, comprising:
   providing a silicon substrate;
   forming a barrier layer over the silicon substrate;
   forming a metal layer over the barrier layer, wherein the metal layer has a thickness substantially greater than a thickness of the barrier layer; and
   implanting ions into localized regions of the silicon substrate by focusing an ion-beam to penetrate through the metal layer and further to penetrate through the thickness of the barrier layer into the silicon substrate, wherein the barrier layer above the localized regions is disrupted by the ion-beam so that the metal layer reacts with the silicon substrate to form metal silicide in the localized regions of the silicon substrate.

9. The method of claim 8, wherein the barrier layer is formed with an oxide.

10. The method of claim 9, wherein the oxide is between 2–4 nanometers in thickness.

11. The method of claim 8, wherein the metal layer is between 34–50 nanometers in thickness.

12. The method of claim 8, wherein the metal layer is formed with cobalt, nickel, chromium, palladium, platinum, wolfram, vanadium, titanium, indium, erbium, hafnium, or rhodium.

13. A method of forming metal silicide in a silicon substrate, comprising:

forming a barrier layer over the silicon substrate;

forming a metal layer over the barrier layer; and implanting ions into localized regions of the silicon substrate by focusing an ion-beam to penetrate through the metal layer and further to penetrate through the thickness of the barrier layer into the silicon substrate.

14. The method of claim 13, wherein the metal layer has a thickness substantially greater than a thickness of the barrier layer.

15. The method of claim 13, wherein the barrier layer above the localized regions is disrupted by the ion-beam so that the metal layer reacts with the silicon substrate to form the metal silicide in the localized regions of the silicon substrate.

16. The method of claim 13, wherein the barrier layer is formed with an oxide.

17. The method of claim 16, wherein the oxide is between 2–4 nanometers in thickness.

18. The method of claim 13, wherein the metal layer is between 34–50 nanometers in thickness.

19. The method of claim 13, wherein the metal layer is formed with cobalt, nickel, chromium, palladium, platinum, wolfram, vanadium, titanium, indium, erbium, hafnium, or rhodium.

20. The method of claim 13, wherein the focused ion-beam implants $As^{++}$ ions.

21. The method of claim 13, further including the step of annealing the silicon substrate.

22. The method of claim 21, further including the step of removing unreacted portions of the metal layer.

23. The method of claim 22, further including the step of removing the oxide layer.

* * * * *